United States Patent
Chen et al.

(10) Patent No.: US 11,430,918 B2
(45) Date of Patent: Aug. 30, 2022

(54) SEMICONDUCTOR DEVICE AND LIGHT-EMITTING SYSTEM

(71) Applicant: XIAMEN SAN'AN OPTOELECTRONICS CO., LTD., Xiamen (CN)

(72) Inventors: Gong Chen, Xiamen (CN); Chuan-gui Liu, Xiamen (CN); Ting-yu Chen, Xiamen (CN); Su-hui Lin, Xiamen (CN); Ling-yuan Hong, Xiamen (CN); Sheng-hsien Hsu, Xiamen (CN); Kang-wei Peng, Xiamen (CN); Chia-hung Chang, Wuhu (CN)

(73) Assignee: XIAMEN SAN'AN OPTOELECTRONICS CO., LTD., Xiamen (CN)

( * ) Notice: Subject to any disclaimer, the term of this patent is extended or adjusted under 35 U.S.C. 154(b) by 120 days.

(21) Appl. No.: 16/872,699

(22) Filed: May 12, 2020

(65) Prior Publication Data

US 2020/0274033 A1 Aug. 27, 2020

Related U.S. Application Data

(63) Continuation-in-part of application No. PCT/CN2018/081670, filed on Apr. 3, 2018.

(30) Foreign Application Priority Data

Nov. 13, 2017 (CN) .......................... 201711112481.5

(51) Int. Cl.
*H01L 33/40* (2010.01)
*H01L 33/44* (2010.01)
(Continued)

(52) U.S. Cl.
CPC .......... *H01L 33/44* (2013.01); *H01L 33/0095* (2013.01); *H01L 33/02* (2013.01);
(Continued)

(58) Field of Classification Search
CPC ......... H01L 33/36; H01L 33/40; H01L 33/44; H01L 33/385; H01L 33/0095; H01L 33/387; H01L 33/02
See application file for complete search history.

(56) References Cited

U.S. PATENT DOCUMENTS 8,366,816 B2 * 2/2013 Bohringer .......... B01J 20/28035
96/134
8,440,507 B1 * 5/2013 Hegde ............... H01L 23/49582
438/123
(Continued)

FOREIGN PATENT DOCUMENTS

| CN | 101431138 A | 5/2009 | |
| CN | 104241320 A | 12/2014 | |
| WO | WO2019/052194 | * 3/2019 | ........... H01L 21/603 |

OTHER PUBLICATIONS

Search Report issued to PCT application No. PCT/CN2018/081670 by the CNIPA dated Jul. 30, 2018.

*Primary Examiner* — Savitri Mulpuri
(74) *Attorney, Agent, or Firm* — Thomas | Horstemeyer, LLP

(57) ABSTRACT

A semiconductor device includes a semiconductor layered structure, an electrode unit, and an anti-adsorption layer. The electrode unit is disposed on an electrode connecting region of the semiconductor layered structure. The anti-adsorption layer is disposed on a top surface of the electrode unit opposite to the semiconductor layered structure and is electrically connected to the electrode unit. The anti-adsorption layer has an adsorption capacity for at least one of gaseous contaminants and particulate contaminants which is (Continued)

lower than that of the electrode unit. Also disclosed herein is a light-emitting system including the semiconductor device.

18 Claims, 3 Drawing Sheets

(51) Int. Cl.
*H01L 33/38* (2010.01)
*H01L 33/00* (2010.01)
*H01L 33/36* (2010.01)
*H01L 33/02* (2010.01)

(52) U.S. Cl.
CPC ............ *H01L 33/36* (2013.01); *H01L 33/385* (2013.01); *H01L 33/40* (2013.01)

(56) References Cited

U.S. PATENT DOCUMENTS

| | | | |
|---|---|---|---|
| 2002/0068466 A1* | 6/2002 | Lee | C23C 16/45531 438/765 |
| 2005/0230691 A1* | 10/2005 | Amiotti | H01L 33/44 257/79 |
| 2010/0233836 A1* | 9/2010 | Kyotani | H01L 21/02472 438/46 |
| 2014/0368107 A1* | 12/2014 | Jung | H05B 33/10 313/504 |
| 2016/0192481 A1* | 6/2016 | Boday | H05K 1/0209 428/457 |
| 2018/0016678 A1* | 1/2018 | Fenwick | C23C 16/40 |

\* cited by examiner

SEMICONDUCTOR DEVICE AND LIGHT-EMITTING SYSTEM

CROSS-REFERENCE TO RELATED APPLICATION

This application is a continuation-in-part application of PCT International Application No. PCT/CN2018/081670 filed on Apr. 3, 2018, which claims priority of Chinese Invention Patent Application No. 201711112481.5, filed on Nov. 13, 2017. The entire content of each of the international and Chinese patent applications is incorporated herein by reference.

FIELD

The present disclosure relates to a semiconductor device and a light-emitting system.

BACKGROUND

Fabrication of a semiconductor device with improved performance has become one of the most important focuses in the industry. Electrode structures (such as electrode pads) are mainly made of gold (Au) or aluminum. When wire bonding regions of the electrode pads are exposed to the air, certain pollutants in the air might be easily adsorbed on the surface thereof, causing contamination of the electrode pads. Taking an Au electrode as an example, which has weak bonding interactions between Au molecules, when the semiconductor device is exposed to organic compounds such as epoxy silane, the Au molecules (serving as superatoms) allow the epoxy silane to undergo polycondensation and curing on the surface of the Au electrode to form a layer of cyclic high-nuclearity cluster compounds which appear to be adsorbed on the surface of the Au electrode, causing aerosol contamination of the Au electrode.

In addition, referring to FIG. 1, a light emitting diode (LED) chip 10 of the semiconductor device, after formation thereof, still needs to undergo several processes, such as mounting, sorting, transportation, etc. During these processes, the wire bonding regions of the Au electrodes 20 of the LED chip 10 are exposed to the air, causing gaseous contaminants and particulate contaminants 50 such as silica gel in the air, to be adsorbed on the wire bonding regions. In a subsequent packaging process, the LED chip 10 is subjected to die bonding on a packaging substrate 30 by heating and curing a die bonding paste 40, certain reactive small molecules (e.g., $SiH_4$, etc.) in which might form aerosol 41 that is easily adsorbed on the wire bonding regions of the Au electrodes 20. Thus, the resultant accumulation of organic contaminants on the Au electrodes 20 impairs wire bonding (i.e., wire bonding cannot be conducted or only can be poorly performed), thereby affecting the quality of the LED chip 10.

SUMMARY

Therefore, an object of the present disclosure is to provide a semiconductor device and a light-emitting system that can alleviate at least one of the drawbacks of the prior art.

According to an aspect of the present disclosure, the semiconductor device includes a semiconductor layered structure, an electrode unit, and an anti-adsorption layer. The electrode unit is disposed on an electrode connecting region of the semiconductor layered structure. The anti-adsorption layer is disposed on a top surface of the electrode unit opposite to the semiconductor layered structure and is electrically connected to the electrode unit. The anti-adsorption layer has an adsorption capacity for at least one of gaseous contaminants and particulate contaminants which is lower than that of the electrode unit.

According to another aspect of the present disclosure, the light-emitting system includes at least one the abovementioned semiconductor device.

BRIEF DESCRIPTION OF THE DRAWINGS

Other features and advantages of the present disclosure will become apparent in the following detailed description of the embodiments with reference to the accompanying drawings, of which.

DETAILED DESCRIPTION

Figure 1:
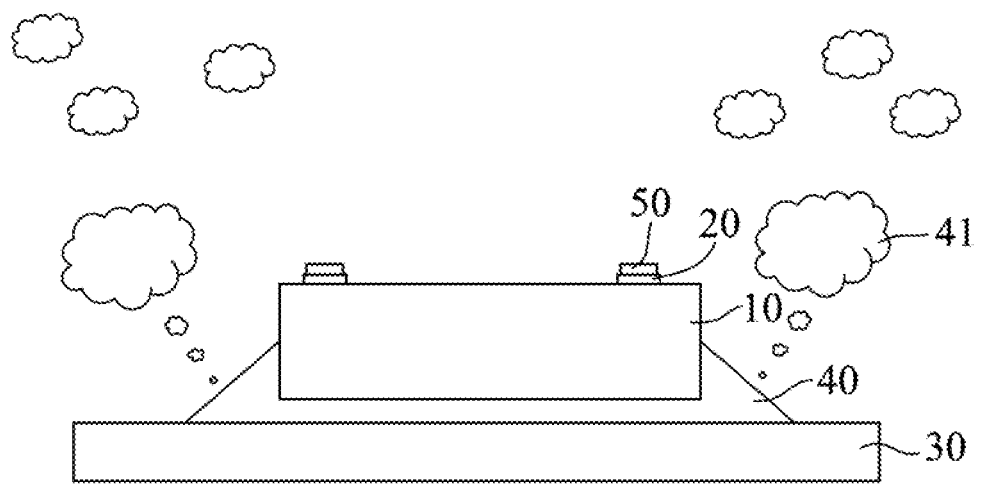
FIG. 1 is a schematic view illustrating adsorption of contaminants on an Au electrode of a conventional semiconductor device.

Before the present disclosure is described in greater detail, it should be noted that where considered appropriate, reference numerals or terminal portions of reference numerals have been repeated among the figures to indicate corresponding or analogous elements, which may optionally have similar characteristics.

Figure 2:
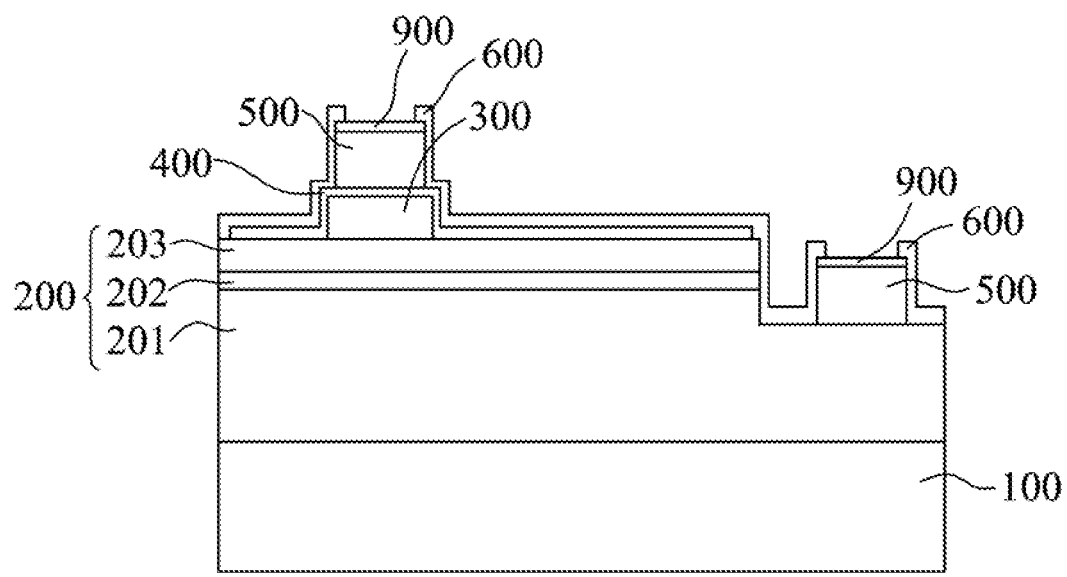
FIG. 2 is a schematic sectional view illustrating a first embodiment of a semiconductor device according to the present disclosure.

Referring to FIG. 2, a first embodiment of a semiconductor device, such as a light emitting diode (LED) chip and a laser diode chip, according to the present disclosure includes a substrate 100, a semiconductor layered structure 200, an electrode unit 500, a passivation layer 600, and an anti-adsorption layer 900.

The substrate 100 may be a sapphire substrate.

The semiconductor layered structure 200 includes a first-type semiconductor layer 201 that is disposed on the substrate 100, a light emitting layer 202 that is disposed on the first-type semiconductor layer 201 opposite to the substrate 100, a second-type semiconductor layer 203 that is disposed on the light-emitting layer 202 opposite to the first-type semiconductor layer 201, a current blocking layer 300 that is disposed on a portion of the second-type semiconductor layer 203, and a transparent conductive layer 400 that is disposed over the current blocking layer 300 and on the second-type semiconductor layer 203.

The term "first-type" refers to being doped with a first type dopant, and the term "second-type" refers to being doped with a second type dopant that is opposite in conductivity to the first type dopant. For instance, the first type dopant may be an n-type dopant, and the second type dopant may be a p-type dopant, and vice versa.

Exemplary materials suitable for making the transparent conductive layer 400 may include, but are not limited to, indium tin oxide (ITO), zinc oxide (ZnO), cadmium tin oxide (CTO), indium oxide (InO), indium-doped zinc oxide (InZnO), aluminum-doped zinc oxide (AlZnO), gallium-doped zinc oxide (GaZnO), and combinations thereof.

The electrode unit 500 is disposed on an electrode connecting region of the semiconductor layered structure 200. In this embodiment, the electrode unit 500 includes two electrodes, one of which is disposed on an exposed surface of the transparent conductive layer 400 opposite to the current blocking layer 300, and the other one of which is disposed on an exposed surface of the first-type semiconductor layer 201 opposite to the substrate 100. The electrode unit 500 may be a single-layer structure that is a metal surface layer for wire bonding, or may be a multi-layered structure that may include a metal contacting layer, a metal separation layer, and a metal surface layer which are sequentially formed on the electrode connecting region of the semiconductor layered structure 200 in such order. The electrode unit 500, when in the form of the multi-layered structure, may further include a metal reflective layer disposed between the metal contacting layer and the metal separation layer. Alternatively, the metal reflective layer may be disposed between the metal separation layer and the metal surface layer.

The electrode unit 500 is made of an electrode material. Examples of the electrode material suitable for making the metal contacting layer of the multi-layered structure may include, but are not limited to, chromium (Cr), titanium (Ti), and tin (Sn). Examples of the electrode material suitable for making the metal separation layer of the multi-layered structure may include, but are not limited to, Ti, platinum (Pt), nickel (Ni), cobalt (Co), palladium (Pd), and tungsten (W). Examples of the electrode material suitable for making the metal surface layer serving as the single-layer structure or a layer of the multi-layered structure may include, but are not limited to, gold (Au) and aluminum (Al). In this embodiment, the electrode unit 500 is a three-layered structure (Cr/Pt/Au) that includes the metal contacting layer made of Cr, the metal separation layer made of Pt, and the metal surface layer made of Au. In a variation of the first embodiment, the electrode unit 500 may be a two-, three- or four-layered structure, and includes the metal surface layer made of Al. For example, the electrode unit 500 may be made of Cr/Al, Ti/Al, Cr/Pt/Al, Cr/Ti/Al, or Cr/Al/Ti/Al.

The passivation layer 600 is disposed on the semiconductor layered structure 200 (opposite to the substrate 100) and a periphery of the electrode unit 500 to almost entirely steer clear of the top surface of the electrode unit 500, so as to provide electrical insulation effect. Exemplary materials suitable for making the passivation layer 600 may include, but are not limited to, $SiO_2$, $Si_3N_4$, $Al_2O_3$, and $TiO_2$. In this embodiment, the passivation layer 600 is made from $SiO_2$.

The anti-adsorption layer 900 is disposed on the top surface (i.e., the metal surface layer) of the electrode unit 500 opposite to the semiconductor layered structure 200, and is electrically connected to the electrode unit 500. The anti-adsorption layer 900 has an adsorption capacity for at least one of the gaseous contaminants and particulate contaminants which is lower than that of the electrode unit 500, so as to inhibit adsorption of the gaseous contaminants and/or particulate contaminants on the top surface of 5I the electrode unit 500.

Moreover, it should be noted that the metal surface layer of the electrode unit 500 commonly made of Au or Al may have reactive small molecules (e.g., $SiH_4$), which cause aerosol contamination, adsorbed thereon. The reason is that Al has a face-centered cubic (fcc) crystal structure with a radius of octahedral interstices of 0.6 Å (in which an atom radius of Al is 1.43 Å and lattice constants a, b, and c all are 4.05 Å), and Au also has a face-centered cubic crystal structure with a radius of octahedral interstices of 0.6 Å (in which an atom radius of Au is 1.44 Å and all of lattice constants a, b and c are 4.08 Å), such that the covalently-bonded Si and H atoms, which respectively have covalent radii of 1.11 Å and 0.32 Å, may be easily embedded in the octahedral interstices of the face-centered cubic crystal structure of Au or Al. Therefore, in certain embodiments, the anti-adsorption layer 900 has an adsorption capacity for aerosol 800 which is lower than that of the electrode unit 500.

The anti-adsorption layer 900 may have a thickness that is greater than 0 nm and not greater than 100 nm, which will not impair wire bonding. In this embodiment, the thickness of the anti-adsorption layer 900 ranges from 5 nm to 50 nm. The anti-adsorption layer 900 is made of a metallic material selected from a metal and an alloy including the metal. The metallic material of the anti-adsorption layer 900 has a face-centered cubic structure with a radius of octahedral interstices smaller than that of the electrode material of the electrode unit 500, i.e., Al or Au. For example, the anti-adsorption layer 900 may be made of platinum (Pt), iridium (Ir), nickel (Ni), copper (Cu), or an alloy thereof. Since the radii of octahedral interstices of Pt, Ir, Ni, and Cu, which are 0.57 Å, 0.56 Å, 0.52 Å, and 0.53 Å, respectively, are all smaller than that of Au (i.e., 0.6 Å) and that of Ai (i.e., 0.6 Å), adsorption of reactive small molecules on the top surface of the electrode unit 500 can be effectively inhibited, so as to effectively reduce aerosol contamination.

Figure 3:
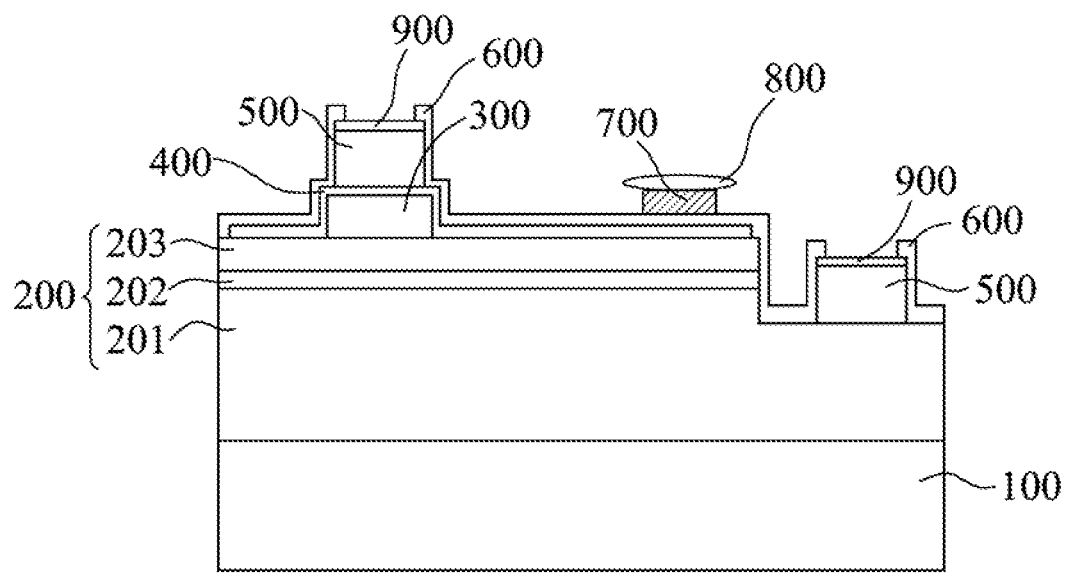
FIG. 3 is a schematic sectional view illustrating a second embodiment of the semiconductor device according to the present disclosure.

Referring to FIG. 3, a second embodiment of the semiconductor device according to this disclosure is substantially similar to the first embodiment except that in the second embodiment, the semiconductor device further includes an adsorption layer 700 that is disposed on a non-electrode connecting region of the semiconductor layered structure 200 different in location from the electrode connecting region, and that has an adsorption capacity for at least one of the gaseous contaminants and particulate contaminants which is higher than that of the electrode unit 500.

In this embodiment, the adsorption layer 700 is disposed above the passivation layer 600 by a spin coating process, or a deposition process such as physical vapor deposition (e.g., evaporation and sputtering), chemical vapor deposition, electroplating, and electroless deposition. Alternatively, the adsorption layer 700 may be disposed between the passivation layer 600 and the transparent conductive layer 400, and then the passivation layer 600 may be subjected to a patterning process to expose a portion of the adsorption layer 700.

The adsorption layer 700 and the electrode unit 500 may be spaced apart by a distance of not greater than 300 nm. The adsorption layer 700 may have a thickness that ranges from 1 nm to 100 nm. In this embodiment, the adsorption layer 700 has a thickness that ranges from 5 nm to 100 nm. The adsorption layer 700 may be continuously formed or formed with a pattern on the semiconductor layered structure 200. In this embodiment, the adsorption layer 700 is formed with a pattern. The adsorption layer 700 may be made of a material selected from a metallic material, a nano metal oxide material, graphene, activated carbon, porous ceramic, and combinations thereof. In this embodiment, the adsorption layer 700 is made of the metallic material that has hydrogen-storage capacity and is one of a metal and an alloy. Examples of such metallic material of the adsorption layer 700 may include, but are not limited to, Pd, $LaNi_5$, $NdNi_5$, $CaNi_5$, $TiNi_5$, $LaAl_5$, $LaFe_5$, $LaCr_5$, $LaCu_5$, $LaSi_5$, $LaSn_5$, FeTi, MnTi, CrTi, TiCu, $MgZn_2$, $NiMg_2$, $ZrCr_2$, $ZrMn_2$, and combinations thereof. Compared to the metal surface layer of the electrode unit 500 which is made of Au, the adsorption layer 700 preferentially adsorbs the gaseous contaminants, the particulate contaminants and the reactive small molecules (such as SiH). Therefore, the aerosol 800 is preferentially adsorbed on the adsorption layer 700, so that contamination in a wire bonding region on the metal surface layer of the electrode unit 500 can be effectively reduced. As a result, failure of the wire bonding can be avoided, thereby improving the reliability and quality of the semiconductor device.

Figure 4:
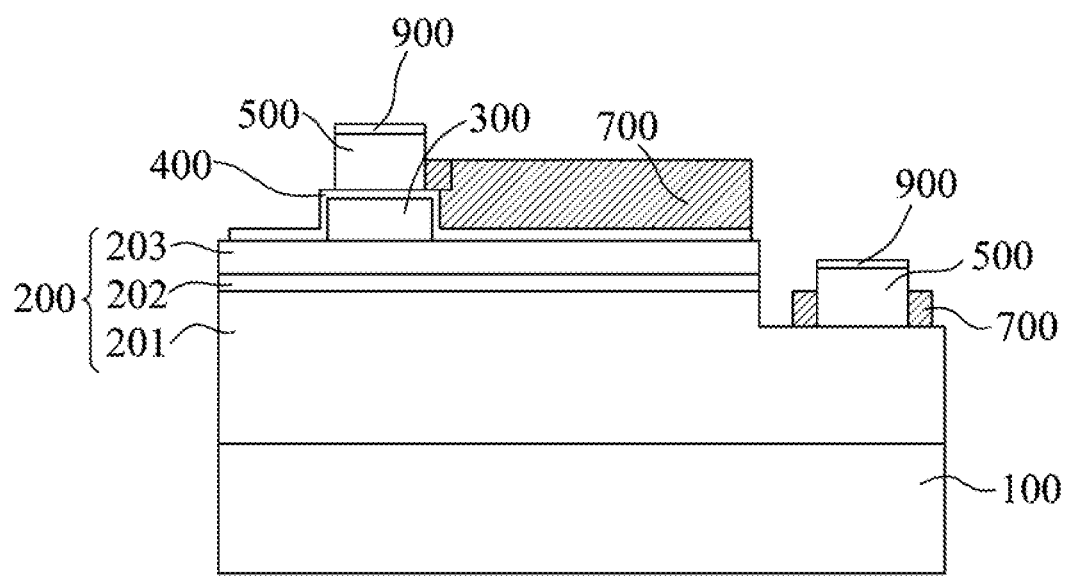
FIG. 4 is a schematic sectional view illustrating a third embodiment of the semiconductor device according to the present disclosure.

Referring to FIG. 4, a third embodiment of the semiconductor device according to this disclosure is substantially similar to the second embodiment except that in the third embodiment, the passivation layer 600 is omitted, and the adsorption layer 700 is electrically connected to the electrode unit 500 for serving as a finger of the electrode unit 500. In addition, the adsorption layer 700 is made of an electrically conductive material such as graphene, so as to reduce the effect of the adsorption layer 700 on the light intensity of the semiconductor device.

Figure 5:
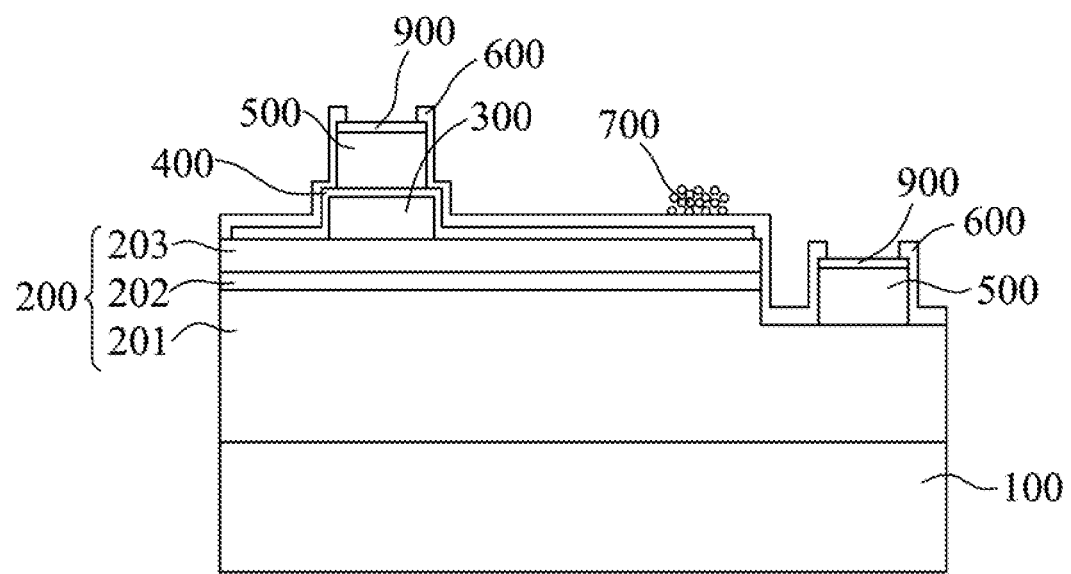
FIG. 5 is a schematic sectional view illustrating a fourth embodiment of the semiconductor device according to the present disclosure.

Referring to FIG. 5, a fourth embodiment of the semiconductor device according to this disclosure is substantially similar to the second embodiment except that in the fourth embodiment, the adsorption layer 700 is made of a nano metal oxide material. Examples of the nano metal oxide material of the adsorption layer 700 may include, but are not limited to, $ZrO_2$, CuO, $TiO_2$, $Al_2O_3$, and combinations thereof. The adsorption layer 700 has a thickness that ranges from 1 nm to 100 nm.

Figure 6:
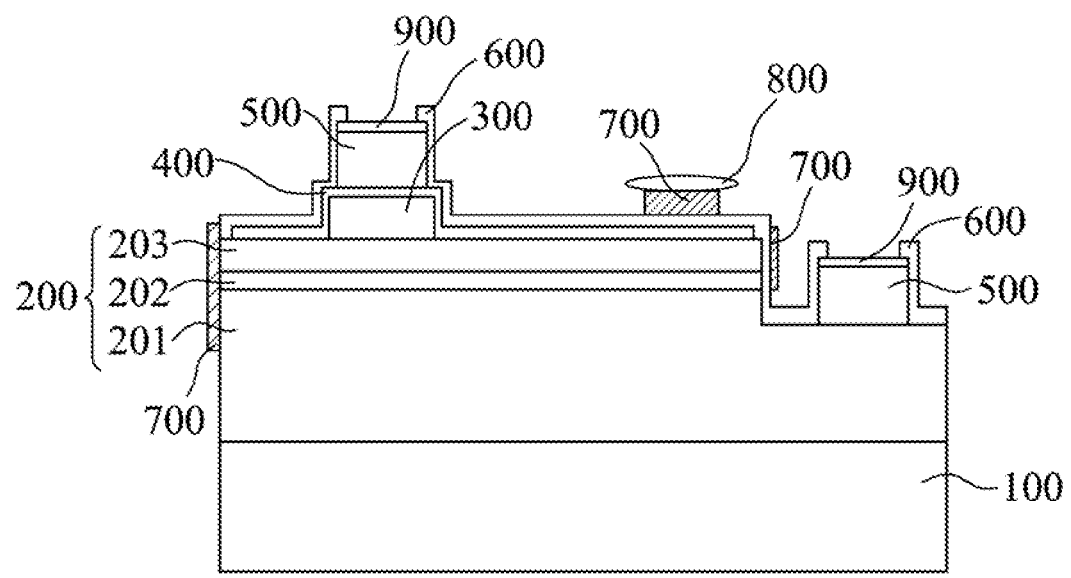
FIG. 6 is a schematic sectional view illustrating a fifth embodiment of the semiconductor device according to the present disclosure.

Referring to FIG. 6, a fifth embodiment of the semiconductor device according to this disclosure is substantially similar to the second embodiment except that in the fifth embodiment, the adsorption layer 700 is made of a non-electrically conductive material such as porous ceramic (i.e., silicate), and is further disposed on a side surface of the non-electrode connecting region of the semiconductor layered structure 200. For example, the semiconductor layered structure 200 may have a mesa which has a lateral surface that extends from an upper surface of the second-type semiconductor layer 203 (which faces away from the substrate 100) towards the first-type semiconductor layer 201, and the adsorption layer 700 may be disposed on the lateral surface of the mesa, such that short circuit caused by leakage of an electrically conductive material outside of the semiconductor layered structure 200 can be avoided, and suspended contaminants such as the aerosol 800 formed during a packaging process can be adsorbed thereon. The adsorption layer 700 may be further disposed on a packaging substrate (not shown in the figures) and may be spaced apart from the electrode unit 500 by a distance of not greater than 300 nm.

In a variation of the fifth embodiment, the semiconductor device may be subjected to a wafer dicing process to from a cutting trench that extends from the semiconductor layered structure 200 to the substrate 100, and the adsorption layer 700 may be disposed on a sidewall of the cutting trench, i.e., between a die bonding paste to be used in the packaging process and the electrode unit 500, such that adverse effects generated by the aerosol 800 formed from the die bonding paste on the electrode unit 500 can be reduced, thereby significantly improving the quality of wire bonding on the semiconductor device.

The present disclosure also provides a light-emitting system that includes at least one of the abovementioned semiconductor device.

In summary, by inclusion of the anti-adsorption layer 900 disposed on the electrode connecting region of the semiconductor layered structure 200, and by further inclusion of the adsorption layer 700 disposed on the non-electrode connecting region of the semiconductor layered structure 200, adsorption of gaseous contaminants, particulate contaminants, and the aerosol 800 on the top surface of the electrode unit 500 can be effectively reduced, thereby enhancing the reliability of wire bonding on the electrode unit 500 of the semiconductor device according to the present disclosure.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the present disclosure has been described in connection with what is considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A semiconductor device, comprising:
    a semiconductor layered structure;
    an electrode unit disposed on an electrode connecting region of said semiconductor layered structure;
    an anti-adsorption layer disposed on a top surface of said electrode unit opposite to said semiconductor layered structure and electrically connected to said electrode unit, said anti-adsorption layer having an adsorption capacity for at least one of gaseous contaminants and particulate contaminants which is lower than that of said electrode unit; and
    an adsorption layer disposed on a non-electrode connecting region of said semiconductor layered structure different in location from said electrode connecting region of said semiconductor layered structure, said adsorption layer having an adsorption capacity for at least one of the gaseous contaminants and particulate contaminants which is higher than that of said electrode unit.

2. The semiconductor device as claimed in claim 1, wherein said anti-adsorption layer has an adsorption capacity for aerosol which is lower than that of said electrode unit.

3. The semiconductor device as claimed in claim 1, wherein said anti-adsorption layer has a thickness that is greater than 0 nm and not greater than 100 nm.

4. The semiconductor device as claimed in claim 3, wherein the thickness of said anti-adsorption layer ranges from 5 nm to 50 nm.

5. The semiconductor device as claimed in claim 1, wherein said anti-adsorption layer is made of a metallic material selected from the group consisting of a metal and an alloy including the metal, said electrode unit including a metal surface layer that is made of an electrode material, said metallic material of said anti-adsorption layer having a face-centered cubic structure with a radius of octahedral interstices smaller than that of said electrode material of said electrode unit.

6. The semiconductor device as claimed in claim 5, wherein said metallic material of said anti-adsorption layer is selected from the group consisting of platinum, iridium, nickel, copper, and an alloy thereof.

7. The semiconductor device as claimed in claim 1, wherein said adsorption layer is electrically connected to said electrode unit for serving as a finger of said electrode unit.

8. The semiconductor device as claimed in claim 1, wherein said adsorption layer has a thickness that ranges from 1 nm to 100 nm.

9. The semiconductor device as claimed in claim 1, wherein said non-electrode connecting region includes a side surface of said semiconductor layered structure.

10. The semiconductor device as claimed in claim 1, wherein said adsorption layer and said electrode unit are spaced apart by a distance of not greater than 300 mm.

11. The semiconductor device as claimed in claim 1, wherein said adsorption layer is made of a material selected from the group consisting of a metallic material, an nano metal oxide material, graphene, activated carbon, porous ceramic, and combinations thereof.

12. The semiconductor device as claimed in claim 11, wherein said metallic material of said adsorption layer has hydrogen-storage capacity and is one of a metal and an alloy.

13. The semiconductor device as claimed in claim 12, wherein said metallic material of said adsorption layer is selected from the group consisting of Pd, $LaNi_5$, $NdNi_5$, $CaNi_5$, $TiNi_5$, $LaAl_5$, $LaFe_5$, $LaCr_5$, $LaCu_5$, $LaSi_5$, $LaSn_5$, FeTi, MnTi, CrTi, TiCu, $MgZn_2$, $NiMg_2$, $ZrCr_2$, $ZrMn_2$, and combinations thereof.

14. The semiconductor device as claimed in claim 11, wherein said nano metal oxide material of said adsorption layer is selected from the group consisting of $ZrO_2$, CuO, $TiO_2$, $Al_2O_3$, and combinations thereof.

15. The semiconductor device as claimed in claim 5, wherein said electrode material is selected from the group consisting of gold and aluminum.

16. A light-emitting system including at least one semiconductor device as claimed in claim 1.

17. The light-emitting system as claimed in claim 16, wherein said anti-adsorption layer of said semiconductor device has a thickness that is greater than 0 nm and not greater than 100 nm.

18. The light-emitting system as claimed in claim 16, wherein said anti-adsorption layer of said semiconductor device is made of a metallic material selected from the group consisting of a metal and an alloy including the metal, said electrode unit of said semiconductor device including a metal surface layer that is made of an electrode material, said metallic material of said anti-adsorption layer having a face-centered cubic structure with a radius of octahedral interstices smaller than that of said electrode material of said electrode unit.

* * * * *